United States Patent
Ma et al.

(10) Patent No.: US 9,813,067 B2
(45) Date of Patent: Nov. 7, 2017

(54) CLOCK SIGNAL AND SUPPLY VOLTAGE VARIATION TRACKING

(71) Applicant: Micron Technology, Inc., Boise, ID (US)

(72) Inventors: Yantao Ma, Boise, ID (US); Tyler Gomm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/736,005

(22) Filed: Jun. 10, 2015

(65) Prior Publication Data

US 2016/0365860 A1    Dec. 15, 2016

(51) Int. Cl.
  *H03L 7/08* (2006.01)
  *H03K 5/156* (2006.01)
  *H03L 7/081* (2006.01)
  *H03L 7/089* (2006.01)

(52) U.S. Cl.
  CPC ......... *H03L 7/0802* (2013.01); *H03K 5/1565* (2013.01); *H03L 7/0812* (2013.01); *H03L 7/0891* (2013.01)

(58) Field of Classification Search
  CPC ... H03K 5/1565; H03L 7/0802; H03L 7/0812; H03L 7/0891
  USPC ........ 327/31, 33, 37, 39, 40, 41, 47, 50, 51, 327/52, 63, 65, 77, 89, 141, 142, 143
  See application file for complete search history.

(56) References Cited

U.S. PATENT DOCUMENTS

| | | |
|---|---|---|
| 5,004,933 A | 4/1991 | Widener |
| 6,111,810 A | 8/2000 | Fujita |
| 6,219,384 B1 | 4/2001 | Kliza et al. |
| 6,260,128 B1 | 7/2001 | Ohshima et al. |
| 6,275,077 B1 | 8/2001 | Tobin et al. |
| 6,327,318 B1 | 12/2001 | Bhullar et al. |
| 6,424,592 B1 | 7/2002 | Maruyama |
| 6,438,055 B1 | 8/2002 | Taguchi et al. |

(Continued)

FOREIGN PATENT DOCUMENTS

| | | |
|---|---|---|
| CN | 101752009 A | 6/2010 |
| JP | 2013-222997 A | 10/2013 |
| TW | 201303735 | 1/2013 |

OTHER PUBLICATIONS

U.S. Appl. No. 15/139,102, entitled "Methods and Apparatuses Including Command Delay Adjustment Circuit", filed Apr. 26, 2016.

(Continued)

*Primary Examiner* — William Hernandez
(74) *Attorney, Agent, or Firm* — Dorsey & Whitney LLP

(57) ABSTRACT

Embodiments disclosed herein provide an apparatus comprising a clock generation circuit configured to generate a first signal for a first time period and a second signal for a second time period, a charge pump circuit coupled to the clock generation circuit and configured to generate a first voltage and a second voltage based, at least in part, on the first time period and the second time period, and a comparison circuit coupled to the charge pump circuit, the comparison circuit configured to compare a difference between the first voltage and the second voltage with a threshold value and generate an active tracking enablement signal in response to determining that the difference between the first and second voltages exceeds the threshold value.

22 Claims, 8 Drawing Sheets

(56) References Cited

U.S. PATENT DOCUMENTS

| | | |
|---|---|---|
| 6,459,313 B1 | 10/2002 | Godbee et al. |
| 6,489,823 B2 | 12/2002 | Iwamoto |
| 6,510,095 B1 | 1/2003 | Matsuzaki et al. |
| 6,636,110 B1 | 10/2003 | Ooishi et al. |
| 6,687,185 B1 | 2/2004 | Keeth et al. |
| 6,710,726 B2 | 3/2004 | Kim et al. |
| 6,744,285 B2 | 6/2004 | Mangum et al. |
| 6,781,861 B2 | 8/2004 | Gomm et al. |
| 6,839,288 B1 | 1/2005 | Kim et al. |
| 6,861,901 B2 | 3/2005 | Prexl et al. |
| 6,868,504 B1 | 3/2005 | Lin |
| 6,914,798 B2 | 7/2005 | Kwon et al. |
| 6,930,955 B2 | 8/2005 | Johnson et al. |
| 6,973,008 B2 | 12/2005 | Krause |
| 6,980,479 B2 | 12/2005 | Park |
| 6,988,218 B2 | 1/2006 | Drexler |
| 7,042,799 B2 | 5/2006 | Cho |
| 7,046,060 B1 | 5/2006 | Minzoni et al. |
| 7,058,799 B2 | 6/2006 | Johnson |
| 7,061,941 B1 | 6/2006 | Zheng |
| 7,065,001 B2 | 6/2006 | Johnson et al. |
| 7,111,185 B2 | 9/2006 | Gomm et al. |
| 7,119,591 B1 | 10/2006 | Lin |
| 7,158,443 B2 | 1/2007 | Lin |
| 7,170,819 B2 | 1/2007 | Szczypinski |
| 7,187,599 B2 | 3/2007 | Schnell et al. |
| 7,209,396 B2 | 4/2007 | Schnell |
| 7,248,512 B2 | 7/2007 | Shin |
| 7,268,605 B2 | 9/2007 | Fang et al. |
| 7,269,754 B2 | 9/2007 | Ramaswamy et al. |
| 7,280,430 B2 | 10/2007 | Lee |
| 7,319,728 B2 | 1/2008 | Bell et al. |
| 7,336,752 B2 | 2/2008 | Vlasenko et al. |
| 7,340,632 B2 | 3/2008 | Park |
| 7,355,464 B2 | 4/2008 | Lee |
| 7,375,560 B2 | 5/2008 | Lee et al. |
| 7,411,852 B2 | 8/2008 | Nishioka et al. |
| 7,428,284 B2 | 9/2008 | Lin |
| 7,443,216 B2 | 10/2008 | Gomm et al. |
| 7,451,338 B2 | 11/2008 | Lemos |
| 7,463,534 B2 | 12/2008 | Ku et al. |
| 7,489,172 B2 | 2/2009 | Kim |
| 7,509,517 B2 | 3/2009 | Matsumoto et al. |
| 7,541,851 B2 | 6/2009 | Gomm et al. |
| 7,580,321 B2 | 8/2009 | Fujisawa et al. |
| 7,593,273 B2 | 9/2009 | Chu et al. |
| 7,609,584 B2 | 10/2009 | Kim et al. |
| 7,616,040 B2 | 11/2009 | Motomura |
| 7,631,248 B2 | 12/2009 | Zakharchenko et al. |
| 7,656,745 B2 | 2/2010 | Kwak |
| 7,660,187 B2 | 2/2010 | Johnson et al. |
| 7,663,946 B2 | 2/2010 | Kim |
| 7,671,648 B2 | 3/2010 | Kwak |
| 7,675,439 B2 | 3/2010 | Chang et al. |
| 7,675,791 B2 | 3/2010 | Kim |
| 7,698,589 B2 | 4/2010 | Huang |
| 7,715,260 B1 | 5/2010 | Kuo et al. |
| 7,716,510 B2 | 5/2010 | Kwak |
| 7,751,261 B2 | 7/2010 | Cho |
| 7,773,435 B2 | 8/2010 | Cho |
| 7,822,904 B2 | 10/2010 | LaBerge |
| 7,826,305 B2 | 11/2010 | Fujisawa |
| 7,826,583 B2 | 11/2010 | Jeong et al. |
| 7,872,924 B2 | 1/2011 | Ma |
| 7,876,640 B2 | 1/2011 | Lin |
| 7,885,365 B2 | 2/2011 | Hagleitner et al. |
| 7,913,103 B2 | 3/2011 | Gold et al. |
| 7,928,782 B2 | 4/2011 | Booth et al. |
| 7,945,800 B2 | 5/2011 | Gomm et al. |
| 7,948,817 B2 | 5/2011 | Coteus et al. |
| 7,969,813 B2 | 6/2011 | Bringivijayaraghavan et al. |
| 7,983,094 B1 | 7/2011 | Roge et al. |
| 8,018,791 B2 | 9/2011 | Kwak |
| 8,115,529 B2 | 2/2012 | Shibata |
| 8,116,415 B2 | 2/2012 | Wada et al. |
| 8,144,529 B2 | 3/2012 | Chuang et al. |
| 8,321,714 B2 | 11/2012 | Wu et al. |
| 8,358,546 B2 | 1/2013 | Kim et al. |
| 8,392,741 B2 | 3/2013 | Kim et al. |
| 8,441,888 B2 | 5/2013 | Bringivijayaraghavan et al. |
| 8,509,011 B2 | 8/2013 | Bringivijayaraghavan |
| 8,644,096 B2 | 2/2014 | Bringivijayaraghavan |
| 8,717,078 B2 | 5/2014 | Idgunji et al. |
| 8,732,509 B2 | 5/2014 | Kwak |
| 8,788,896 B2 | 7/2014 | Tekumalla |
| 9,001,955 B2 | 4/2015 | Lamanna et al. |
| 9,053,815 B2 | 6/2015 | Bell |
| 9,054,675 B2 | 6/2015 | Mazumder et al. |
| 9,166,579 B2 | 10/2015 | Huber et al. |
| 9,329,623 B2 | 5/2016 | Vankayala |
| 9,508,409 B2 | 11/2016 | Kwak |
| 9,529,379 B2 | 12/2016 | Kwak |
| 9,530,473 B2 | 12/2016 | Mazumder |
| 9,531,363 B2 | 12/2016 | Miyano |
| 9,601,170 B1 | 3/2017 | Mazumder et al. |
| 2001/0015924 A1 | 8/2001 | Arimoto et al. |
| 2002/0057624 A1 | 5/2002 | Manning |
| 2002/0110035 A1 | 8/2002 | Li et al. |
| 2002/0149506 A1* | 10/2002 | Altrichter .......... H03K 17/9517 341/155 |
| 2003/0117864 A1 | 6/2003 | Hampel et al. |
| 2003/0147299 A1 | 8/2003 | Setogawa |
| 2003/0161210 A1 | 8/2003 | Acharya et al. |
| 2005/0024107 A1 | 2/2005 | Takai et al. |
| 2005/0047222 A1 | 3/2005 | Rentschler |
| 2005/0052309 A1* | 3/2005 | Wang .................. H03K 5/003 341/172 |
| 2005/0132043 A1 | 6/2005 | Wang et al. |
| 2005/0184780 A1* | 8/2005 | Chun .................. H03K 5/1565 327/175 |
| 2005/0270852 A1 | 12/2005 | Dietrich et al. |
| 2006/0062341 A1 | 3/2006 | Edmondson et al. |
| 2006/0064620 A1 | 3/2006 | Kuhn et al. |
| 2006/0155948 A1 | 7/2006 | Ruckerbauer |
| 2006/0182212 A1 | 8/2006 | Hwang et al. |
| 2006/0193194 A1 | 8/2006 | Schnell |
| 2006/0250861 A1 | 11/2006 | Park et al. |
| 2006/0250883 A1 | 11/2006 | Szczypinski |
| 2007/0033427 A1 | 2/2007 | Correale, Jr. et al. |
| 2007/0046346 A1 | 3/2007 | Minzoni |
| 2007/0088903 A1 | 4/2007 | Choi |
| 2007/0192651 A1 | 8/2007 | Schoch |
| 2007/0291558 A1 | 12/2007 | Joo |
| 2008/0080267 A1 | 4/2008 | Lee |
| 2008/0080271 A1 | 4/2008 | Kim |
| 2008/0126822 A1 | 5/2008 | Kim et al. |
| 2008/0137471 A1 | 6/2008 | Schnell et al. |
| 2008/0144423 A1 | 6/2008 | Kwak |
| 2008/0180144 A1 | 7/2008 | Mai |
| 2008/0204071 A1 | 8/2008 | Lee et al. |
| 2008/0232179 A1 | 9/2008 | Kwak |
| 2008/0232180 A1 | 9/2008 | Kim et al. |
| 2008/0253205 A1 | 10/2008 | Park |
| 2009/0041104 A1 | 2/2009 | Bogdan |
| 2009/0219068 A1 | 9/2009 | Mizuhashi et al. |
| 2009/0232250 A1 | 9/2009 | Yamada et al. |
| 2009/0315600 A1 | 12/2009 | Becker et al. |
| 2010/0001762 A1 | 1/2010 | Kim |
| 2010/0052739 A1 | 3/2010 | Shibata |
| 2010/0054060 A1 | 3/2010 | Ku |
| 2010/0066422 A1 | 3/2010 | Tsai |
| 2010/0165769 A1 | 7/2010 | Kuroki |
| 2010/0165780 A1 | 7/2010 | Bains et al. |
| 2010/0177589 A1 | 7/2010 | Kinoshita |
| 2010/0195429 A1 | 8/2010 | Sonoda |
| 2010/0199117 A1 | 8/2010 | Kwak |
| 2010/0208534 A1 | 8/2010 | Fujisawa |
| 2010/0208535 A1 | 8/2010 | Fujisawa |
| 2010/0232213 A1 | 9/2010 | Hwang et al. |
| 2010/0254198 A1 | 10/2010 | Bringivijayaraghavan et al. |
| 2010/0327926 A1 | 12/2010 | Takahashi |
| 2011/0047319 A1 | 2/2011 | Jeon et al. |
| 2011/0055671 A1 | 3/2011 | Kim et al. |
| 2011/0057697 A1 | 3/2011 | Miyano |

(56) References Cited

U.S. PATENT DOCUMENTS

| | | |
|---|---|---|
| 2011/0102039 A1 | 5/2011 | Shin |
| 2011/0228625 A1 | 9/2011 | Bringivijayaraghavan |
| 2011/0238941 A1 | 9/2011 | Xu et al. |
| 2011/0298512 A1 | 12/2011 | Kwak |
| 2012/0084575 A1 | 4/2012 | Flores et al. |
| 2012/0147692 A1 | 6/2012 | Nakamura et al. |
| 2012/0212268 A1 | 8/2012 | Kim |
| 2012/0254873 A1 | 10/2012 | Bringivijayaraghavan |
| 2012/0269015 A1 | 10/2012 | Bringivijayaraghavan |
| 2012/0274376 A1 | 11/2012 | Gomm et al. |
| 2013/0002320 A1 | 1/2013 | Lin et al. |
| 2013/0141994 A1 | 6/2013 | Ito et al. |
| 2013/0194013 A1 | 8/2013 | Kwak et al. |
| 2013/0250701 A1 | 9/2013 | Bringivijayaraghavan et al. |
| 2013/0321052 A1 | 12/2013 | Huber et al. |
| 2013/0329503 A1 | 12/2013 | Bringivijayaraghavan |
| 2013/0342254 A1 | 12/2013 | Mazumder et al. |
| 2014/0010025 A1 | 1/2014 | Bringivijayaraghavan |
| 2014/0035640 A1 | 2/2014 | Kwak et al. |
| 2014/0055184 A1 | 2/2014 | Vankayala |
| 2014/0119141 A1 | 5/2014 | Tamlyn et al. |
| 2014/0176213 A1 | 6/2014 | Rylov |
| 2014/0177359 A1 | 6/2014 | Kumar et al. |
| 2014/0258764 A1 | 9/2014 | Kwak |
| 2014/0293719 A1 | 10/2014 | Jung |
| 2014/0340158 A1* | 11/2014 | Thandri ............... H03F 1/025 330/297 |
| 2015/0156009 A1 | 6/2015 | Bogdan |
| 2015/0170725 A1 | 6/2015 | Kwak |
| 2015/0235691 A1 | 8/2015 | Kwak |
| 2015/0340072 A1 | 11/2015 | Mazumder |
| 2016/0056807 A1 | 2/2016 | Neidengard et al. |
| 2016/0322964 A1 | 11/2016 | Miyano |

OTHER PUBLICATIONS

U.S. Appl. No. 15/243,651, entitled "Apparatuses and Methods for Adjusting Delay of Command Signal Path", filed Aug. 22, 2016.

"Interfacing DDR SDRAM with Stratix II Devices", Version 3.2, Altera Corp, Sep. 2008.

Lee, "How to Implement DDR SGRAM in Graphic System", Samsung Electric, 4Q1998 (Oct.-Dec. 1998).

U.S. Appl. No. 15/660,405, entitled "Apparatuses and Methods for Indirectly Detecting Phase Variations", filed Jul. 26, 2017.

* cited by examiner

CLOCK SIGNAL AND SUPPLY VOLTAGE VARIATION TRACKING

BACKGROUND

Many synchronous semiconductor memories, such as dynamic random access memory ("DRAM"), operate using an input supply voltage and input system clock signal. When the system clock enters into the memory, the clock signal is typically delayed by the internal components of the memory. In order to compensate for the inherent delay in the memory, the memory must synchronize the internal, delayed clock signal with the system clock. Memories typically employ a clock circuit such as a delay locked loop ("DLL") or a phase locked loop ("PLL"). The clock circuit adjusts the timing of internal clock relative to the external clock to account for the internal delay of the memory and ensures that the internal clock of the memory has a timing relative to the external clock so that memory operations, such providing data, receiving data, and receiving commands and address information, is in phase with the external clock of the system. Additionally, typical memories also include a duty cycle correction circuit ("DCC") for generating an internal clock signal with a duty cycle of approximately 50%.

In ideal systems, where the external clock signal and the supply voltage are constant in time, a phase detector in the DLL compares the internal clock phase with the external clock phase in order to determine the proper phase delay to apply in providing the internal clock. In the ideal situation, the DLL could discontinue comparing the internal and external clock cycles once a lock is achieved and continue to apply the determined delay in order to lock the internal and external clocks. The process of comparison and determining the necessary delay is typically known as "tracking." However, external clocks are not ideal clocks because the frequency and duty cycle of the external clock are subject to change over time. Moreover, the magnitude of the supply voltage may also vary over time, causing circuit performance of circuits in the memory to vary as well. The result of these variations is that a determined delay which achieved a lock at one point in time may be insufficient or excessive to achieve a lock at a later point in time.

One way to compensate for the variations in the external clock is to leave DLL tracking on at all times. This method ensures that the internal and external clocks are always locked but is costly in terms of power consumption. Another approach would be to periodically enable DLL tracking based on the activity of the device. For example, DLL tracking may be enabled only when a read event occurs in the device. Periodic DLL tracking represents a lower power alternative to tracking all of the time, but this type of tracking is largely speculative and may enable DLL tracking when no tracking is needed or may fail to enable tracking even when the external clock or system power supply is particularly volatile.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Embodiments of the disclosed circuits disclose low power DLL and/or DCC tracking circuits that monitor the signal clock and supply voltage for variations, for example, clock frequency, duty cycle, and/or supply voltage variations, and enable DLL and DCC tracking based on the variations. Enabling DLL and/or DCC tracking means that a DLL circuit and/or a DCC circuit is actively monitoring and modifying the clock signal in order to correct for phase and/or duty cycle distortion.

Figure 1:
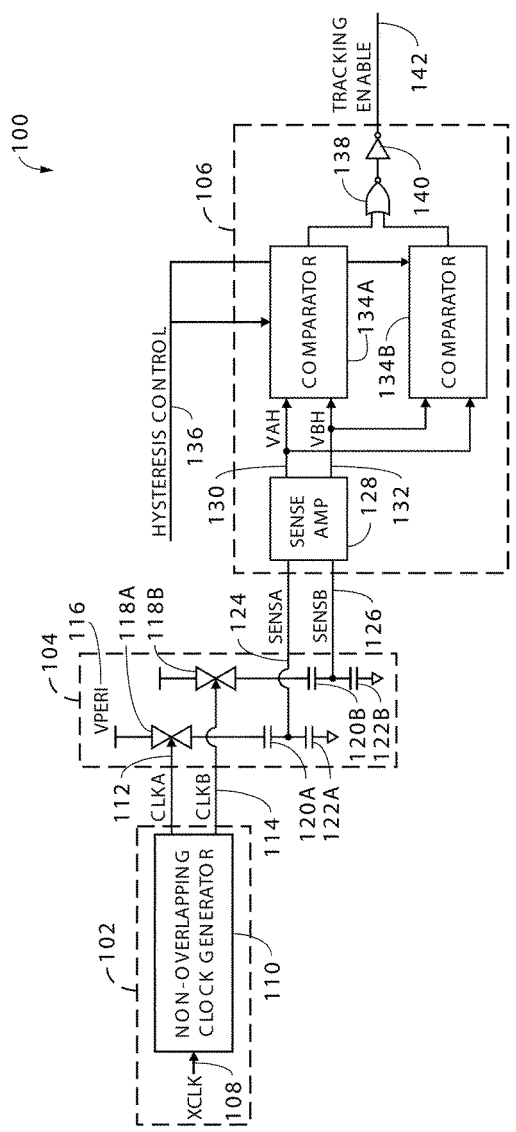
FIG. 1 is a functional block diagram of a DLL tracking enablement circuit based on voltage variations, according to an embodiment of the invention.

Embodiments of the present invention will now be described in detail with respect to the several drawings. FIG. 1 illustrates an apparatus 100 (e.g., an integrated circuit, a memory device, a memory system, an electronic device or system, a smart phone, a tablet, a computer, a server, etc.) according to an embodiment of the disclosure. Apparatus 100 includes a DLL tracking enablement circuit, generally designated 100, in accordance with an embodiment of the present invention. The DLL tracking enablement circuit 100 generally includes a clock generation circuit 102, a charge pump 104, and a comparison circuit 106.

In the embodiment of FIG. 1, the clock generation circuit 102 includes a non-overlapping clock generator 110. The non-overlapping clock generator 110 is an electronic circuit that receives a single clock signal as an input and outputs two discrete clock signals that are non-overlapping. That is, the output signals of the non-overlapping clock generator 110 do not have the same clock level (i.e., a high clock level, or a low clock level) at the same time. In various embodiments, the non-overlapping clock generator 110 receives the system clock, XCLK 108, as an input clock signal. The non-overlapping clock generator 110 outputs two non-overlapping clock signals, CLKA 112 and CLKB 114. An example non-overlapping clock generator is discussed in further detail below with respect to FIG. 6.

The charge pump 104 is an electronic circuit that outputs two signals, SensA 124 and SensB 126, which depend on the input clock signals, CLKA 112 and CLKB 114, and variations in a supply voltage 116. The charge pump 104 includes two parallel charging circuits, one for each of the non-overlapping clock signals CLKA 112 and CLKB 114. Each charging circuit includes a pass gate (e.g., pass gate 118A or 118B), a first capacitor (e.g., capacitor 120A or 120B), and a second capacitor (e.g., capacitor 122A or 122B). The first capacitor 120 and the second capacitor 122 of a charging circuit may be coupled as capacitor divider circuit. A supply voltage 116 is provided to each charging circuit. The supply voltage 116 may be the supply voltage for a memory, such as a DRAM. The pass gates 118A and 118B may be, for example, transistors that act as switches with CLKA 112 and CLKB 114 providing the control signals, respectively. The charging circuits are active when the respective non-overlapping clock signal CLKA 112 and CLKB 114 is at a high clock level. In various embodiments, the capacitors 120A and 120B have the same capacitance. Similarly, the capacitors 122A and 122B may have the same capacitance. Various embodiments may include greater or fewer capacitors. For each charging circuit, the supply voltage 116 is provided to a pass gate (i.e., pass gate 118A or pass gate 118B), which is coupled to a first capacitor (i.e., capacitor 120A or capacitor 120B). Capacitors 120A and 120B may each be coupled to a second capacitor (i.e., capacitors 122A and 122B, respectively), which may then be fed to ground.

When CLKA 112 is at a high clock level, the charging circuit including capacitors 120A and 122A is active, and the pass gate 118A forms a closed switch which allows current to flow from the supply voltage 116 and charge the capacitors 120A and 122A. As the capacitors charge, an output voltage signal SensA 124 is generated by the charging circuit. The output voltage signal SensA 124 is proportional to the supply voltage 116 during the time that the charging circuit is active. Similarly, when CLKB 114 is at a high clock level, the charging circuit including capacitors 120B and 122B is active, and the pass gate 118B forms a closed switch which allows current to flow from the supply voltage 116, charging the capacitors 120B and 122B. As the capacitors charge, an output voltage signal SensB 126 is generated by the charging circuit. The output voltage signal SensB 126 is proportional to the supply voltage 116 during the time that the charging circuit is active. As previously discussed, CLKA 112 and CLKB 114 are non-overlapping clock signals. As a result, SensA 124 and SensB 126 represent signals that are proportional to the supply voltage 116 taken over non-overlapping time periods. Accordingly, if the supply voltage 116 varies between the time period during which SensA 124 is generated and the time period during which SensB 126 is generated, that variation will be manifested as a voltage differential between SensA 124 and SensB 126.

In the embodiment of FIG. 1, the comparison circuit 106 receives as inputs SensA 124 and SensB 126. The comparison circuit 106 is configured to determine a voltage difference between the input signals, and compare the voltage difference to a threshold value in order to determine whether DLL tracking should be enabled. In the embodiment of FIG. 1, the comparison circuit 106 includes a sense amplifier 128, comparators 134A and 134B, a NOR gate 138 and an inverter 140. The sense amplifier 128 may be any type of sense amplifier capable of proportionally amplifying the voltages of SensA 124 and SensB 126 relative to one another. The sense amplifier 128 may output two amplified voltage signals VAH 130 and VBH 132, which are proportional to SensA 124 and SensB 126, respectively.

The comparators 134A and 134B may be any comparison circuits capable of determining a difference between two voltages (e.g., VAH 130 and VBH 132) and determining whether the difference between the two voltages exceeds a predetermined threshold value. The comparators 134A and 134B may include static or adaptive hysteresis which may encourage or discourage the enablement or disablement of DLL tracking depending on past states of the comparator. As will be appreciated by one skilled in the art, in embodiments in which comparators 134A and 134B have adaptive hysteresis, a hysteresis control signal 136 may be used to control the hysteresis. For example, hysteresis control signal 136 may provide an analog or digital weighting factor which can favor or disfavor the activation or deactivation of tracking enablement 142 by altering the threshold value. In the embodiment of FIG. 1, the comparison circuit 106 includes two comparators 134A and 134B. The comparators 134A and 134B may each receive as inputs VAH 130 and VBH 132. One of the comparators (e.g., comparator 134A) may compare the voltage difference of VAH 130 subtracted from VBH 132 with the threshold value. If the comparator 134A determines that the difference between VBH 132 and VAH 130 is greater than the threshold value, then the comparator 134A may output a signal indicating that DLL tracking should be enabled. The second comparator (e.g., comparator 134B) may compare the voltage difference of VBH 132 subtracted from VAH 130 with the threshold value. If comparator 134B determines that the difference between VAH 130 and VBH 132 is greater than the threshold value, then the comparator 134B outputs a signal indicating that DLL tracking should be enabled. By comparing the differences between VAH 130 and VBH 132 with two parallel comparators as described above, the comparison circuit 106 can ensure that DLL tracking is enabled in the event of a positive or negative voltage variation exceeding the threshold value. An example comparator circuit is discussed in more detail below with respect to FIG. 8.

The NOR gate 138 and the inverter 140 are used to provide a tracking enable signal 142 that may be used to enable tracking in response to receiving a signal indicating that the one of the differences between the signals VAH 130 and VBH 132 exceeds the threshold value. Accordingly, DLL tracking is enabled when the comparison circuit 106 determines that the supply voltage 116 has drifted a sufficient (greater than the threshold value) amount over a certain time period determined by CLKA 112 and CLKB 114. When tracking enable signal 142 is active, DLL tracking is enabled and actively monitors and modifies the clock signal in order to account for phase variations in the input clock signal. Tracking enable signal 142 may be provided to, for example, a DLL control circuit which may provide control information to the DLL and manage the delay applied to an input clock signal.

Figure 2:
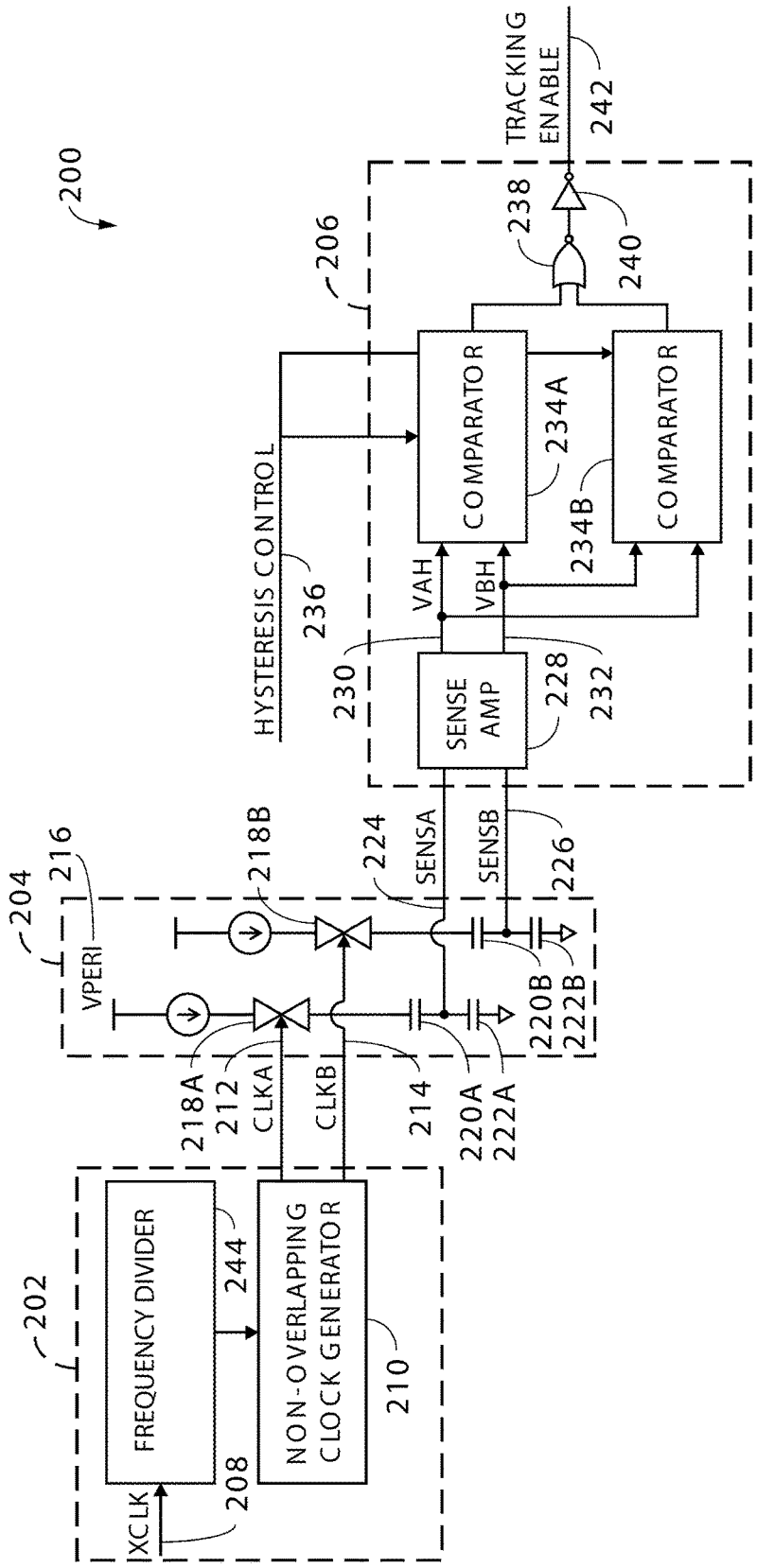
FIG. 2 is a functional block diagram of a DLL tracking enablement circuit based on clock frequency variations, according to an embodiment of the invention.

FIG. 2 is a functional block diagram of a DLL tracking enablement circuit according to an embodiment of the invention, generally designated 200, based on clock frequency variations. The DLL tracking enablement circuit 200 may generally include a clock generation circuit 202, a charge pump 204, and a comparison circuit 206.

The clock generation circuit 202 may include a frequency divider 244 and a non-overlapping clock generator 210. The clock generation circuit 202 receives a clock signal XCLK 208, which may be, for example, the external system clock of a DRAM device. In various embodiments, XCLK 208 may be implemented in similar ways as XCLK 108 as described above with respect to FIG. 1. The frequency divider 244 is an electronic circuit that receives XCLK 208 as an input and outputs a periodic clock signal to the non-overlapping clock generator 210. In various embodiments, the clock signal output by the frequency divider 244 has a frequency that is less than the frequency of XCLK 208. In various embodiments, the frequency divider 244 may be, for example, a configurable $2^N$ divider. In general, the frequency divider 244 may be any integer divider, and may include a duty cycle correction circuit if the frequency divider 244 divides XCLK 208 by an odd integer. The non-overlapping clock generator 210 may be implemented in the same manner as the non-overlapping clock generator 110 as described above with respect to FIG. 1. The non-overlapping clock generator 210 receives the frequency divided clock signal from the frequency divider 244 and generates non-overlapping clock signals CLKA 212 and CLKB 214. A sample non-overlapping clock generation circuit is discussed in further detail below with respect to FIG. 6.

In the embodiment of FIG. 2, the frequency divider 244 reduces the frequency of XCLK 208. Accordingly, a single clock cycle output by the frequency divider 244 corresponds to an integer multiple of XCLK 208 clock cycles. As noted above, the exact frequency of clock cycles of XCLK 208 may vary with time. Such variations are included in the clock cycle output by the frequency divider 244. Therefore, CLKA 212 and CLKB 214 generated by the non-overlapping clock generator 210 represent the time for multiple cycles of XCLK 208 taken at different points in time. For example, one cycle of CLKA 212 may represent the time that passed during $2^N$ cycles of XCLK 208 beginning at a time $t_1$. Similarly, one cycle of CLKB 214 may represent the time that passed during $2^N$ cycles of XCLK 208 beginning at time $t_2$. Because CLKA 212 and CLKB 214 represent the same number of cycles of XCLK 208 and the frequency of XCLK 208 is variable with time, the periods of CLKA 212 and CLKB 214 may be different. That is, CLKA 212 and CLKB 214 have different periods because the frequency of XCLK 208 may have changed between and/or during the times that divider 244 generated the divided clock signal.

The charge pump 204 is an electronic circuit for providing two comparable signals whose voltages depend on CLKA 212 and CLKB 214. The charge pump 204 receives CLKA 212 and CLKB 214 as input signals and outputs two signals SensA 224 and SensB 226 with voltages proportional to the periods of CLKA 212 and CLKB 214, respectively. In various embodiments, charge pump 204 includes two charging circuits. Each charging circuit includes a constant current source 216 coupled to a pass gate (i.e., pass gate 218A or 218B). The pass gates 218A and 218B may be coupled to capacitors 220A and 220B, respectively. Capacitors 220A and 220B may be coupled to capacitors 222A and 222B, respectively, which are coupled to ground. Output signals SensA 224 and SensB 226 may be generated between capacitors 220A and 222A and between capacitors 220B and 222B, respectively.

Each charging circuit generates an output signal (e.g., SensA 224 or SensB 226) during the time period that the respective input signal (e.g., CLKA 212 or CLKB 214) has a high clock level. When CLKA 212 has a high clock level, the pass gate 218A allows current to flow from the constant current source 216 through the charging circuit. During the time that CLKA 212 has a high clock level, the capacitor 220A will accumulate charge and develop a voltage differential according to the relationship $$V = \frac{I \cdot t}{C},$$

where I is the constant current provided by the constant current source 216, t is the time period during which CLKA 212 has a high clock level, and C is the capacitance of the capacitor 220A. As one skilled in the art will appreciate, the output signal SensA 224 will have a voltage proportional to the voltage across the capacitor 220A, which is proportional to the time period, t, during which CLKA 212 has a high clock level. Accordingly, the voltage of the output signal SensA 224 is also proportional to the time period during which CLKA 212 has a high clock level. The second charging circuit, which includes the constant current source 216, the pass gate 218B, and the capacitors 220B and 222B, operates in an analogous manner to the first charging circuit. Accordingly, the output signal SensB 226 is proportional to the time period during which the input clock signal CLKB 214 has a high clock level. As noted above, CLKA 212 and CLKB 214 may be active for different lengths of time if the frequency of XCLK 208 changes between or during the sample times over which CLKA 212 and CLKB 214 were generated by the frequency divider 244. Therefore, a change in the clock frequency of XCLK 208 between or during the sample times of CLKA 212 and CLKB 214 is proportionally reflected as a voltage difference between SensA 224 and SensB 226.

The comparison circuit 206 is an electronic circuit that amplifies and compares the differences between SensA 224 and SensB 226 with a threshold value. The comparison circuit 206 generally includes a sense amplifier 228, comparators 234A and 234B, NOR gate 238 and inverter 240. In various embodiments, comparison circuit 206 may be substantially the same as comparison circuit 106, as described above with respect to FIG. 1. The sense amplifier 228 receives SensA 224 and SensB 226 as input signals, proportionally amplifies the voltages of the received signals, and outputs signals VAH 230 and VBH 232. An example sense amplifier circuit is discussed below with respect to FIG. 7.

The comparators 234A and 234B may compare the differences between VAH 230 and VBH 232 with a threshold value and outputs a respective signal indicative of whether the difference exceeds the threshold value. For example, one of the comparators (e.g., comparator 234A) compares the voltage difference of VAH 230 subtracted from VBH 232 with a threshold value. If the comparator 234A determines that the difference between VBH 232 and VAH 230 is greater than the threshold value, then comparator 234A may output a signal indicating that DLL tracking should be enabled. The second comparator (e.g., comparator 234B) compares the voltage difference of VBH 232 subtracted from VAH 230 with the threshold value. Similarly, if the comparator 234B determines that the difference between VAH 230 and VBH 232 is greater than the threshold value, then the comparator 234B outputs a signal indicating that DLL tracking should be enabled. By comparing the differences between VAH 230 and VBH 232 with two parallel comparators as described above, the comparison circuit 206 ensures that DLL tracking is enabled in the event of an increased or decreased clock frequency variation exceeding the threshold value.

The comparators 234A and 234B may include static or adaptive hysteresis which may encourage or discourage the enablement of DLL tracking depending on past states of the comparator. In various embodiments in which comparators 234A and 234B have adaptive hysteresis, a hysteresis control signal 236 may be used to control the hysteresis, as will be appreciated by one skilled in the art. An example comparator circuit implementing static hysteresis is discussed in more detail below with respect to FIG. 8.

The NOR gate 238 and the inverter 240 are used to provide tracking enable signal 242 that may be used to enable tracking in response to receiving a signal from one of the comparators (234A or 234B) indicating that the one of the differences between signals VAH 230 or VBH 232 exceeds the threshold value. Accordingly, DLL tracking is enabled when the comparison circuit 106 determines that the clock frequency of XCLK 208 has drifted a sufficient (greater than the threshold value) amount over a certain time period, as determined by CLKA 212 and CLKB 214, and the tracking enable signal 242 is active.

The embodiment of FIG. 2 may be modified in order to monitor both voltage variations (as described with respect to the embodiment of FIG. 1) and clock frequency variations. In order to monitor both voltage variations and clock frequency variations, the constant current source 216 may be replaced with the supply voltage of the memory, such as supply voltage 116 in FIG. 1. In such embodiments, the current of the supply voltage depends upon the variable voltage of the supply. In this embodiment, it is possible for a change in supply voltage and a change in clock frequency to offset each other, in which case DLL tracking would not be enabled.

Figure 3:
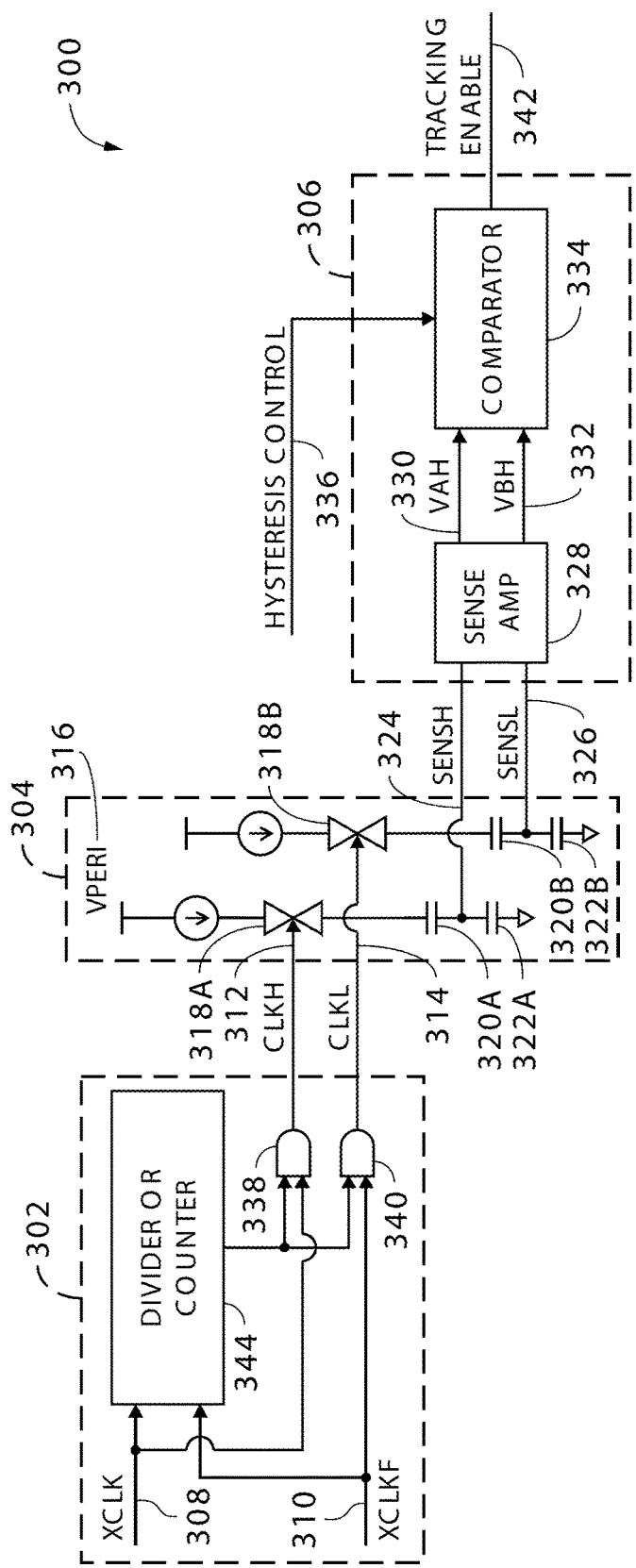
FIG. 3 is a functional block diagram of a DCC tracking enablement circuit based on duty cycle variations, according to an embodiment of the invention.

FIG. 3 is a functional block diagram of a DCC tracking enablement circuit according to an embodiment of the invention, generally designated 300. The DCC tracking enablement circuit 300 generally includes a clock generation circuit 302, a charge pump 304, and a comparison circuit 306.

The clock generation circuit 302 includes a frequency divider 344, an AND gate 338, and an AND gate 340. The clock generation circuit 302 receives a clock signal XCLK 308 and a clock signal XCLKF 310. In various embodiments, XCLK 308 may be the system clock and XCLKF 310 may be the same as XCLK 308, but with a phase delay relative to XCLK 308. In certain embodiments, XCLK 308 and XCLKF 310 may be complimentary signals. However, as will be appreciated by one skilled in the art, overlap may exist as a result of duty cycle variation in the input clock signals XCLK 308 and XCLKF 310. XCLK 308 and XCLKF 310 are provided to the frequency divider 344. The frequency divider 344 may be any frequency divider or counter circuit capable of receiving a periodic signal as an input and outputting a periodic signal having a reduced frequency. In various embodiments, the frequency divider 344 may be implemented in a similar manner to frequency divider 244 as discussed above with respect to FIG. 2. The output of the frequency divider 344 defines the time period over which duty cycle variation is being sampled. The AND gate 338 receives as inputs XCLK 308 and the output of the frequency divider 344. The AND gate 338 generates an output signal CLKH 314 which has a high clock level when, during the sample period defined by the output of the frequency divider 344, XCLK 308 has a high clock level. Accordingly, the time during which CLKH has a high clock level is proportional to the duty cycle of XCLK 308 during the sample period. The AND gate 340 receives as inputs XCLKF 310 and the output of the frequency divider 344. The AND gate 340 outputs a signal CLKL 316 that has a high clock level when, during the sample period defined by the output of the frequency divider 344, CLKF has a high clock level. When XCLK 308 and XCLKF 310 are complimentary signals, CLKL 316 is proportional to the time during the sample period that XCLK 308 has a low clock level (i.e. the compliment of the duty cycle of XCLK 308). In other words, either CLKH or CLKL will be active during the sample period, but CLKH and CLKL are not active at the same time.

The charge pump 304 includes a current source 316, pass gates 318A and 318B, and capacitors 320A, 320B, 322A and 322B. In various embodiments, the charge pump 304 may be implemented in a similar manner as charge pumps 104 and 204 as described above with respect to FIGS. 1 and 2. However, because CLKH and CLKL are proportional to the duty cycle of XCLK 308, the time during which the two charging circuits of the charge pump 304 are active is also proportional to the duty cycle of XCLK 308. The charge pump 304 outputs two signals, SensH 324 and SensL 326, which have voltages that are proportional to the high clock level portion and the low clock level portion of XCLK 308 during the sample time, respectively.

The comparison circuit 306 receives as inputs SensH 324 and SensL 326 and generally includes a sense amplifier 328 and a comparator 334. The comparison circuit 306 may be implemented in a similar manner as comparison circuits 106 and 206 as described above with respect to FIGS. 1 and 2. Sense amplifier 328 may proportionally amplify SensH 324 and SensL 326 to generate VAH 330 and VBH 332. Comparator 334 may compare a difference between VAH 330 and VBH 332 with a threshold value and output an active or inactive tracking enable signal 342 having a logic level indicative of whether the difference between VAH 330 and VBH 332 exceeds a threshold value. The comparator 334 may include static or adaptive hysteresis, which may be controlled by hysteresis control signal 336. As will be appreciated by those skilled in the art, a determination by the comparator 334 that the difference between VAH 330 and VBH 332 exceeds a threshold value indicates that the duty cycle of XCLK 308 has departed from the ideal 50% by more than a threshold value, and therefore a DCC correction circuit should be enabled to correct for the duty cycle variation. The tracking enable signal 342 may be provided, for example, to a DCC control circuit capable of managing a duty cycle correction applied to an input clock signal.

Figure 4:
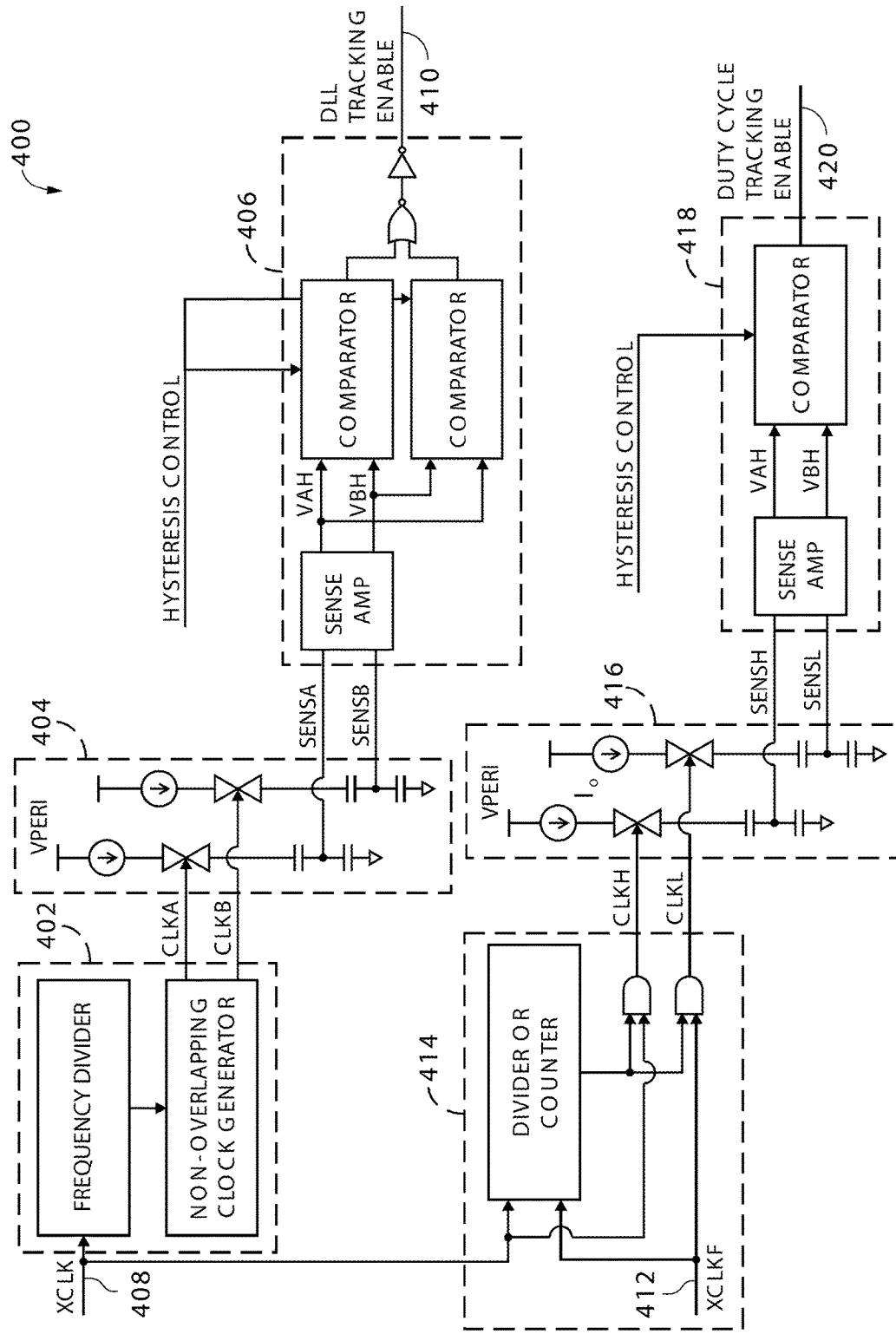
FIG. 4 is a functional block diagram of a combination DLL and DCC tracking enablement circuit according to an embodiment of the invention.

FIG. 4 is a functional block diagram of a combination DLL and DCC tracking enablement circuit according to an embodiment of the invention, generally designated 400. The DLL and DCC tracking enablement circuit 400 includes clock generation circuits 402 and 414, charge pumps 404 and 416, and comparison circuits 406 and 418. The DLL and DCC tracking enablement circuit 400 receives a clock signal, XCLK 408, and a clock signal, XCLKF 412 as inputs. The DLL and DCC tracking enablement circuit 400 outputs a DLL tracking enable signal 410 and a DCC tracking enable signal 420. The clock generation circuit 402 may be implemented in the same manner as clock generation circuit 102 or 202 as described above with respect to FIGS. 1 and 2, respectively. Clock generation circuit 414 may be implemented in the same manner as clock generation circuit 302 as described above with respect to FIG. 3. Charge pumps 404 and 416 may be implemented in the same manner as charge pumps 104, 204, and 304 as described above with respect to FIGS. 1-3. Comparison circuits 406 and 418 may be implemented in the same manner as comparison circuits 106, 206, and 306 as described above with respect to FIGS. 1-3. The DLL and DCC tracking enablement circuit 400 provides a customizable composite circuit for determining whether to enable DLL and/or DCC tracking. The embodiment of FIG. 4 recognizes that it may be desirable to have different voltage comparison threshold values or different frequency dividers between the DLL tracking enablement circuit and the DCC tracking enablement circuit. Accordingly, the embodiment of FIG. 4 provides a parallel configuration which allows for customized circuit components between the DLL tracking enablement circuit and the DCC tracking enablement circuit.

Figure 5:
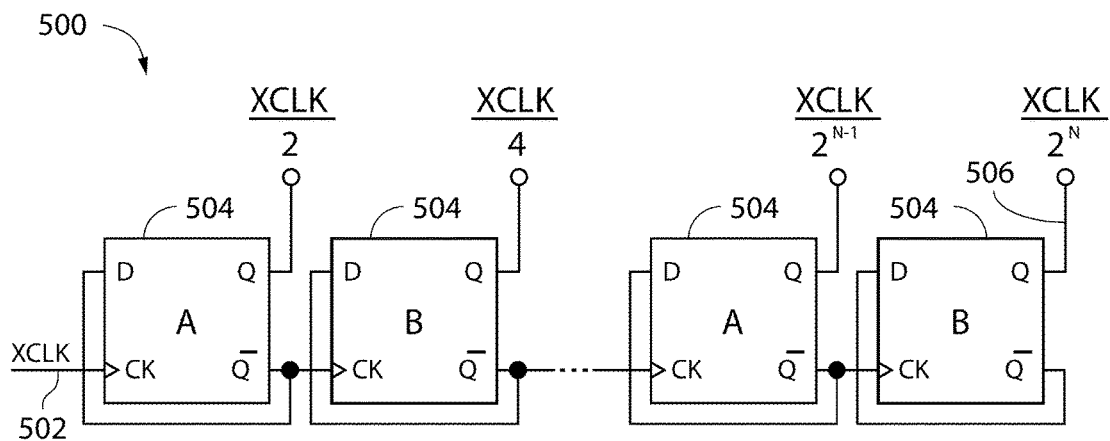
FIG. 5 is a schematic diagram of a frequency divider according to an embodiment of the invention for use in a DLL and/or DCC tracking enablement circuit.

FIG. 5 is a schematic diagram of an example $2^N$ frequency divider circuit according to an embodiment of the invention, generally designated 500. The frequency divider circuit 500 may be used in a DLL and/or DCC tracking enablement circuit. Frequency divider circuit 500 generally includes a number, N, of D flip-flops 504 which are linked together in serial such that the inverted output of one D flip-flop 504 provides the clock signal of the following D flip-flop 504. The output of each D flip-flop 504 has a frequency equal to the frequency of the input clock divided by a power of two. In certain embodiments, the frequency divider 500 has a division period of less than 256 cycles (i.e., a $2^8$ division). In various embodiments, frequency divider 500 may be implemented as frequency divider 244 or 344 as described above with respect to FIGS. 2 and 3. Other frequency divider circuits are possible without departing from the scope of the present disclosure.

Figure 6:
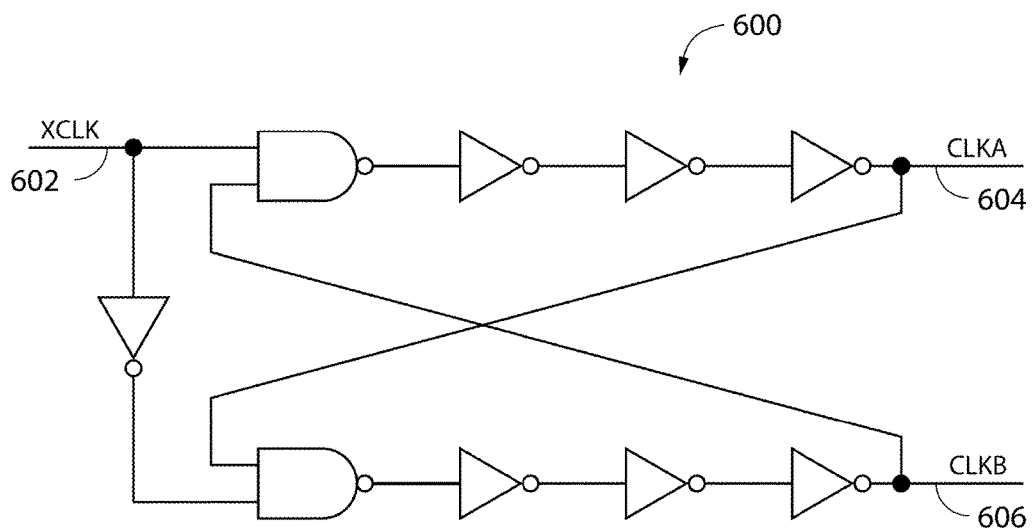
FIG. 6 is a schematic diagram of a non-overlapping clock generation circuit according to an embodiment of the invention for use in a DLL and/or DCC tracking enablement circuit.

FIG. 6 is a schematic diagram of a non-overlapping clock generation circuit according to an embodiment of the invention, generally designated 600. The non-overlapping clock generation circuit may be used in a DLL and/or DCC tracking enablement circuit. As will be appreciated by one skilled in the art, the clock generation circuit 600 generally receives a periodic clock signal XCLK 602 and generates two non-overlapping clock signals CLKA 604 and CLKB 606 using NAND gates and inverters with feedback. In various embodiments, clock generator 600 may be implemented as non-overlapping clock generators 110 and 210 as discussed above. Clock generator 600 represents an example clock generator. Those skilled in the art will recognize that other possible non-overlapping clock generation circuits may be used without departing from the scope of this disclosure.

Figure 7:
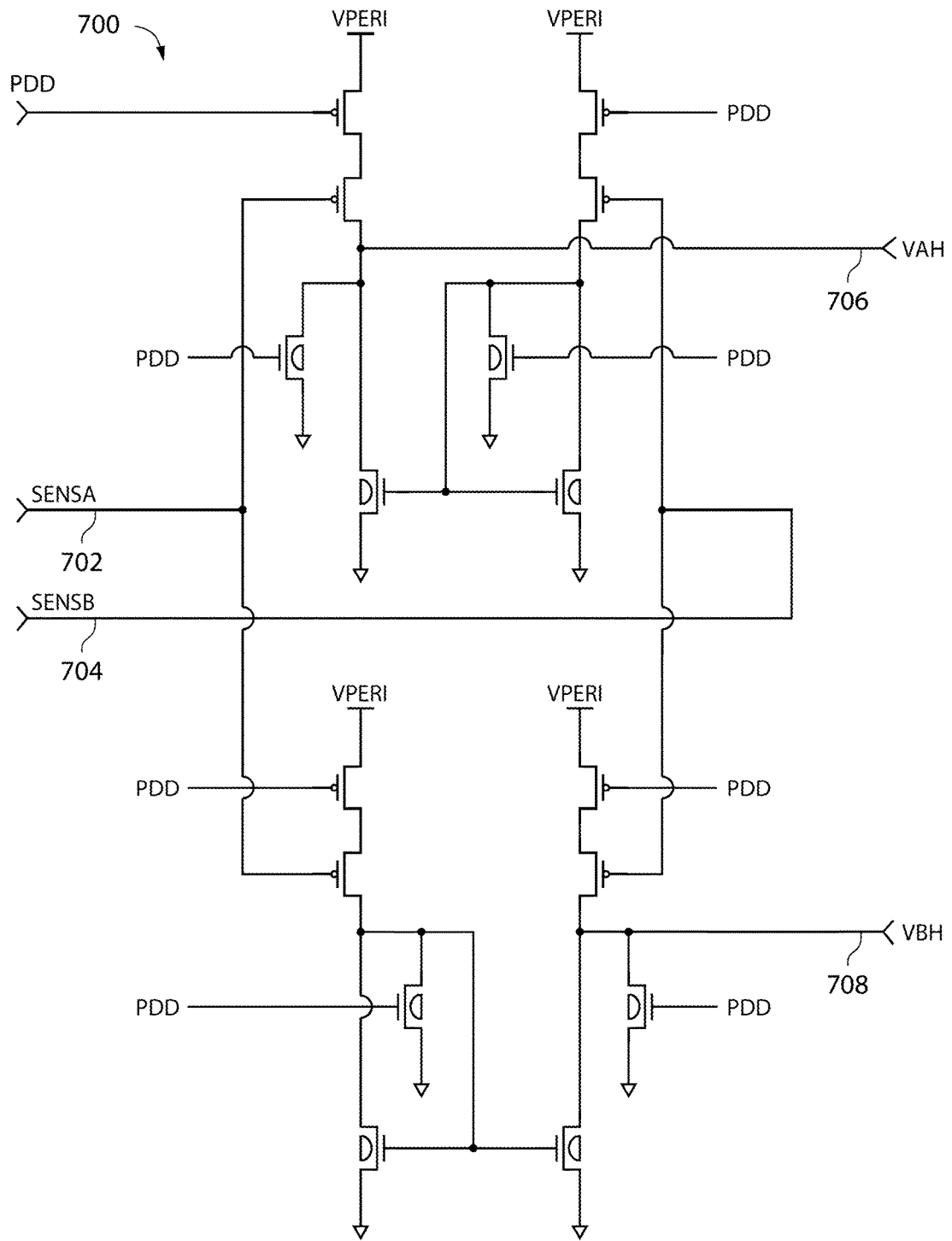
FIG. 7 is a schematic diagram of a sense amplifier according to an embodiment of the invention for use in a DLL and/or DCC tracking enablement circuit.

FIG. 7 is a schematic diagram of a sense amplifier according to an embodiment of the invention, generally designated 700. The sense amplifier 700 may be used in a DLL and/or DCC tracking enablement circuit. In various embodiments, sense amplifier 700 may be implemented as sense amplifier 128, 228, and/or 328, as described above with respect to FIGS. 1-3. As will be appreciated by one skilled in the art, sense amplifier 700 receives two input signals SensA 702 and SensB 704, proportionally amplifies each input signal through two identical amplifier circuits, and outputs two output signals VAH 706 and VBH 708. SensA 702 may be implemented as SensA 124, 224, and/or SensH 324, as discussed above with respect to FIGS. 1-3. Similarly, SensB 704 may be implemented as SensB 126, 226, and/or SensL 326, as discussed above with respect to FIGS. 1-3. VAH 706 may be implemented as VAH 130, 230, and/or 330, as discussed above with respect to FIGS. 1-3. Similarly, VBH 708 may be implemented as VAH 132, 232, and/or 332, as discussed above with respect to FIGS. 1-3. The sense amplifier 700 represents an example sense amplifier. Those skilled in the art will recognize that other possible sense amplifiers may be used without departing from the scope of this disclosure.

Figure 8:
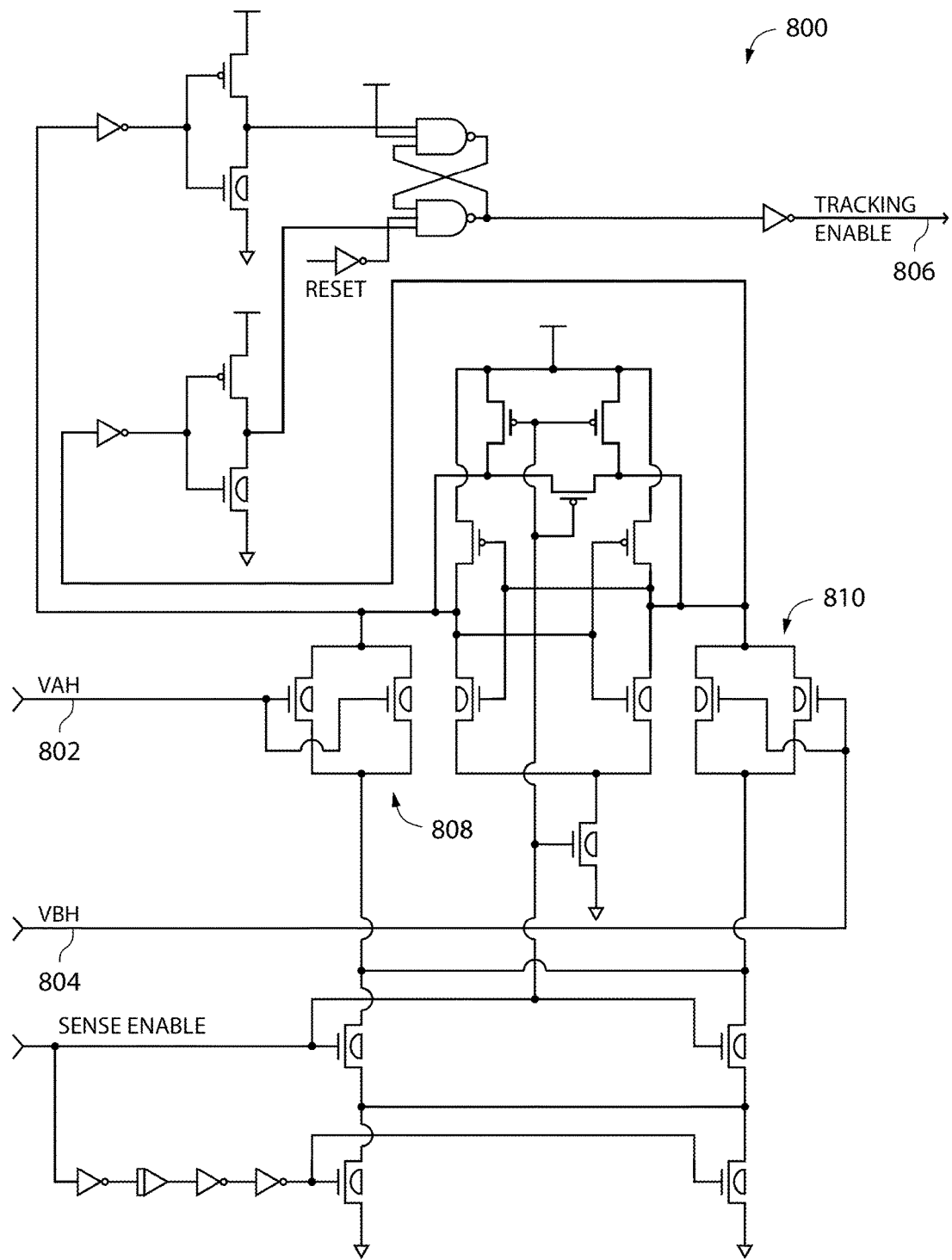
FIG. 8 is a schematic diagram of a comparator circuit according to an embodiment of the invention for use in a DLL and/or DCC tracking enablement circuit.

FIG. 8 is a schematic diagram of a comparator circuit according to an embodiment of the invention, generally designated 800. The comparator circuit 800 may be used in a DLL and/or DCC tracking enablement circuit. In various embodiments, comparator 800 may be implemented as one or more of comparators 134A, 134B, 234A, 234B, or 334. As shown in FIG. 8, comparator 800 may be a differential comparator having two pairs of transistors 808 and 810. As will be appreciated by one skilled in the art, by varying the relative strengths of transistor pairs 808 and 810, a static hysteresis may be applied to the comparator 800. The comparator compares the difference between the input signals VAH 802 and VBH 804 to a predetermined threshold value and outputs a tracking enable signal 806 if the comparator 800 determines that the difference between VAH 802 and VBH 804 exceeds the threshold value. In other embodiments, the comparator 800 may include a feedback loop and/or a hysteresis control signal which allow for adaptive hysteresis capabilities. By using adaptive hysteresis, the comparator 800 may reduce the frequency with which tracking is enabled and therefore reduce the power consumed by a DLL, a DCC correction circuit, or both. The comparator 800 represents an example comparator. Those skilled in the art will recognize that other possible comparators may be used without departing from the scope of this disclosure.

Figure 9:
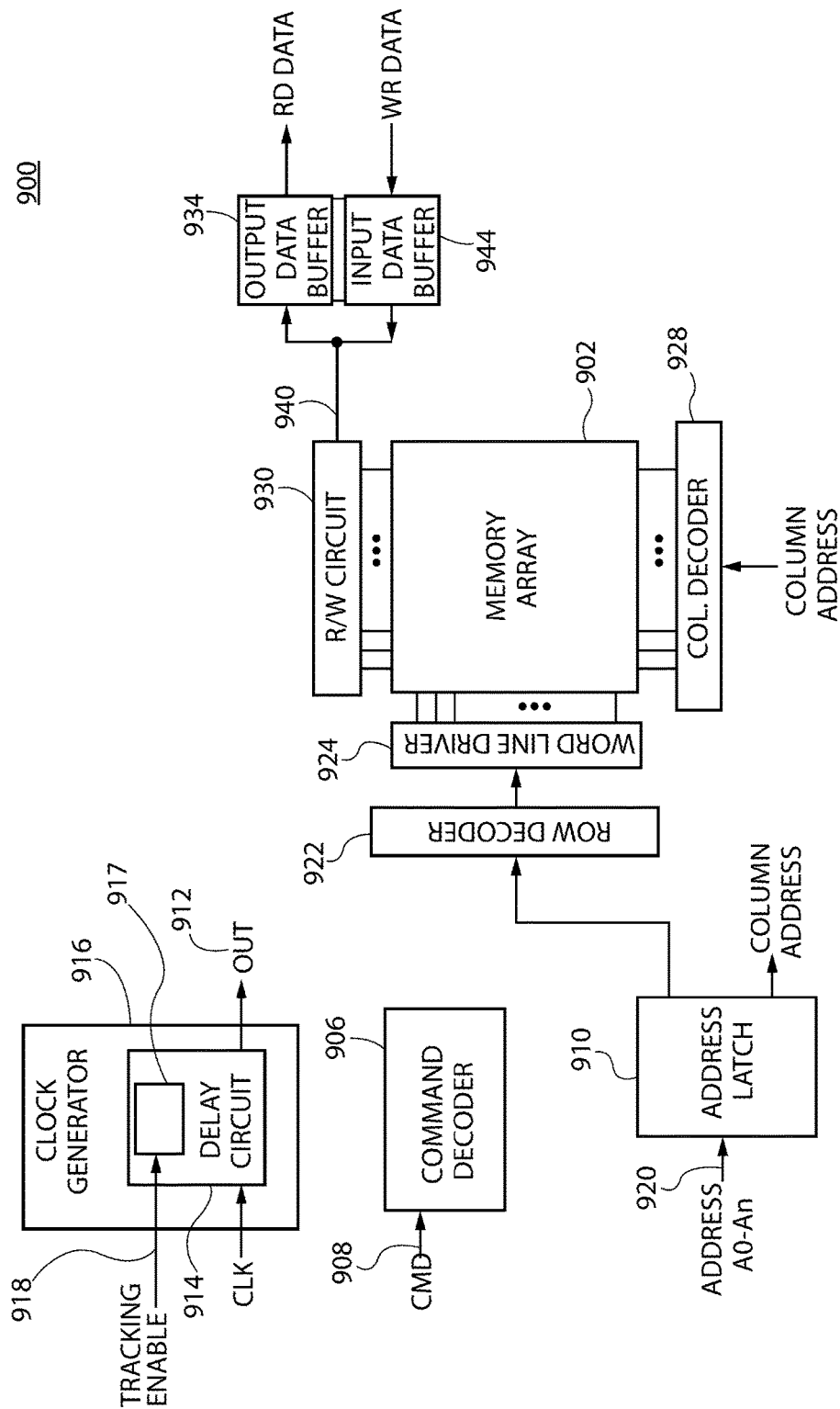
FIG. 9 is a block diagram of a memory, according to an embodiment of the invention

FIG. 9 is a block diagram of a memory, according to an embodiment of the invention. The memory 900 may include an array 902 of memory cells, which may be, for example, volatile memory cells (e.g., dynamic random-access memory (DRAM) memory cells, static random-access memory (SRAM) memory cells), non-volatile memory cells (e.g., flash memory cells), or some other types of memory cells. The memory 900 includes a command decoder 906 that may receive memory commands through a command bus 908 and provide (e.g., generate) corresponding control signals within the memory 900 to carry out various memory operations. For example, the command decoder 906 may respond to memory commands provided to the command bus 908 to perform various operations on the memory array 902. In particular, the command decoder 906 may be used to provide internal control signals to read data from and write data to the memory array 902. Row and column address signals may be provided (e.g., applied) to an address latch 910 in the memory 900 through an address bus 920. The address latch 910 may then provide (e.g., output) a separate column address and a separate row address.

The address latch 910 may provide row and column addresses to a row address decoder 922 and a column address decoder 928, respectively. The column address decoder 928 may select bit lines extending through the array 902 corresponding to respective column addresses. The row address decoder 922 may be connected to a word line driver 924 that activates respective rows of memory cells in the array 902 corresponding to received row addresses. The selected data line (e.g., a bit line or bit lines) corresponding to a received column address may be coupled to a read/write circuitry 930 to provide read data to an output data buffer 934 via an input-output data path 940. Write data may be provided to the memory array 902 through an input data buffer 944 and the memory array read/write circuitry 930.

The memory 900 may include a clock generator 916 that includes a delay circuit 914. The delay circuit 914 provides an output clock signal OUT 912 signal that may be used for clocking circuitry of the memory 900. The delay circuit 914 may include one or more tracking enablement circuits 917, which can be activated by a tracking enable signal 918, according to embodiments of the invention. For example, the delay circuit 914 may include a tracking enablement circuit 917 in accordance with any of the previously described embodiments with reference to FIGS. 1-4.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

In the embodiment of FIGS. 1-4, the variation of frequency and/or the duty cycle of the input clock signal 108, 208, 308, 310, 408 or 412 are translated into the variation of signal voltage level of the output signals SENSA, SENSB, SENSH or SENSL. The signal voltage level is stored in the capacitors 122A, 122B, 222A, 222B, 322A, 322B as signal information based on a corresponding time period of the input clock signal 108, 208, 308, 310, 408 or 412. The signal information stored in the capacitors may also include the variation of supply voltage level of the power supply voltage source VPERI 116, 216 or 316. The comparison circuit 106, 206, 306, 406, 418 in FIGS. 1-4 is coupled to the capacitors as storage elements and configured to provide a control signal. The control signal may include a tracking enable signal 142, 242, 342, 410, and/or 420. Those skilled in the art will appreciate that the comparison circuit 106, 206, 306, 406, 418 may be constructed of a logic circuit though the comparison circuit in FIG. 7 or FIG. 8 is constructed by an analogue circuit.

The embodiment may include steps of monitoring a signal information, such as a variation of supply voltage of the power source, a variation of a frequency and/or a duty cycle of input clock signal, detecting whether the signal information exceeds a predetermined value, and providing a tracking enable signal enabling a tracking enablement circuit, such as a DLL tracking circuit and a duty cycle tracking circuit, if the signal information exceeds the predetermined value.

The comparison circuit may be called a control circuit which can provide a control signal based on two signal information. The control signal can include an active tracking enablement signal enabling an active tracking circuit such as a DLL tracking circuit and a duty cycle tracking circuit. One of the two signal information may be information obtained by monitoring a status such as the voltage source, the frequency or the duty cycle of the input clock signal. The other of the two signal information may be reference information such as a predetermined value or an average value obtained during a predetermined period. Moreover, in the embodiment of FIGS. 1 and 2, the comparison circuit 106, 206 includes the two comparators 134A and 134B, 234A and 234B, respectively, however, those skilled in the art will appreciate that the comparison circuit 106, 206 may be constructed of single comparator with hysteresis control, respectively, like the comparison circuit 306 in FIG. 3.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. An apparatus comprising:
a clock generation circuit configured to generate a first signal for a first time period and a second signal for a second time period;
a charge pump circuit coupled to the clock generation circuit and configured to generate a first voltage and a second voltage based, at least in part, on the first time period and the second time period; and
a comparison circuit coupled to the charge pump circuit, the comparison circuit comprising a sense amplifier configured to proportionally amplify the first voltage and the second voltage and configured to compare a difference between the first voltage and the second voltage with a threshold value and generate an active tracking enablement signal in response to determining that the difference between the first and second voltages exceeds the threshold value.

2. The apparatus of claim 1, wherein the clock generation circuit comprises a non-overlapping clock generator.

3. The apparatus of claim 2, wherein
the non-overlapping clock generator generates the first signal and the second signal based on an input clock signal,
wherein the first signal and the second signal comprise non-overlapping, periodic signals.

4. The apparatus of claim 3, wherein
the first time period is proportional to a first frequency of the input clock signal; and
the second time period is proportional to a second frequency of the input clock signal.

5. The apparatus of claim 3, wherein the clock generation circuit comprises a frequency divider.

6. The apparatus of claim 5, wherein the frequency divider is coupled to the non-overlapping clock generator.

7. The apparatus of claim 1, wherein the charge pump comprises a first charging circuit and a second charging circuit.

8. The apparatus of claim 7, wherein each of the first and second charging circuits comprises:
a pass gate configured to be coupled to a voltage source and further configured to allow current to flow from the voltage source based, at least in part, on the first signal or the second signal; and
one or more capacitors configured to charge in response to the pass gate allowing current to flow from the voltage source.

9. The apparatus of claim 8, wherein the first voltage is generated by the first charging circuit and wherein the second voltage is generated by the second charging circuit.

10. The apparatus of claim 8, wherein a voltage output of the voltage source varies with time.

11. The apparatus of claim 8, wherein the voltage source comprises a constant current voltage source.

12. The apparatus of claim 1, wherein the comparison circuit further comprises one or more comparators configured to compare a voltage difference between the amplified first voltage and the amplified second voltage with the threshold value.

13. The apparatus of claim 12, wherein the one or more comparators have at least one of static hysteresis and adaptive hysteresis.

14. The apparatus of claim 12, wherein the one or more comparators comprise:
    a first comparator configured to compare the amplified first voltage subtracted from the amplified second voltage with the threshold value; and
    a second comparator configured to compare the amplified second voltage subtracted from the amplified first voltage with the threshold value.

15. A method comprising:
    generating a first voltage based on a first voltage associated with a voltage supply, a first frequency associated with an input clock signal, or combinations thereof;
    generating a second voltage based on a second voltage associated with the voltage supply, a second frequency associated with the input clock signal, or combinations thereof;
    comparing a difference between the first voltage and the second voltage with a first threshold value to determine whether a delay-locked loop circuit should be enabled; and
    responsive to determining that the difference between the first voltage and the second voltage exceeds the first threshold value, transmitting a signal to enable the delay-locked loop circuit.

16. The method of claim 15, further comprising:
    responsive to determining that the difference between the first voltage and the second voltage does not exceed the first threshold value, transmitting a signal to disable the delay-locked loop circuit.

17. The method of claim 15, further comprising:
    generating a third voltage based on a duty cycle of the input clock signal;
    generating a fourth voltage based on a complimentary signal of the input clock signal; and
    comparing a difference between the third voltage and the fourth voltage with a second threshold value to determine whether a duty cycle correction circuit should be enabled.

18. The method of claim 17 further comprising:
    responsive to determining that the difference between the third voltage and the fourth voltage exceeds the second threshold value, transmitting a signal to enable the duty cycle correction circuit.

19. The method of claim 17 further comprising:
    responsive to determining that the difference between the third voltage and the fourth voltage does not exceed the second threshold value, transmitting a signal to disable the duty cycle correction circuit.

20. An apparatus comprising:
    a first storage element configured to be activated during a first time period to store a first signal information;
    a second storage element configured to be activated during a second time period to store a second signal information;
    a control circuit coupled to the first and second storage elements and configured to provide a control signal responsive, at least in part, to the first and second signal information; and
    an active tracking circuit configured to provide a clock signal and wherein the active tracking circuit is configured to be activated in response, at least in part, to the control signal, wherein the active tracking circuit comprises at least one of a DLL tracking circuit and a duty cycle tracking circuit.

21. The apparatus of claim 20, wherein each of the first and second signal information is related to a level of a power supply voltage supplied to the active tracking circuit.

22. The apparatus of claim 20, wherein each of the first and second signal information is related to a cycle of the clock signal.

* * * * *